(12) United States Patent
Komatsu

(10) Patent No.: US 10,861,694 B2
(45) Date of Patent: Dec. 8, 2020

(54) METHOD OF MANUFACTURING AN INSULATION LAYER ON SILICON CARBIDE

(71) Applicant: ZF Friedrichshafen AG, Friedrichshafen (DE)

(72) Inventor: Yuji Komatsu, Kawasaki (JP)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 16/478,347

(22) PCT Filed: Dec. 21, 2017

(86) PCT No.: PCT/EP2017/083988
§ 371 (c)(1),
(2) Date: Jul. 16, 2019

(87) PCT Pub. No.: WO2018/134024
PCT Pub. Date: Jul. 26, 2018

(65) Prior Publication Data
US 2019/0371601 A1 Dec. 5, 2019

(30) Foreign Application Priority Data

Jan. 17, 2017 (DE) .................. 10 2017 200 615

(51) Int. Cl.
*H01L 21/00* (2006.01)
*H01L 21/02* (2006.01)
(Continued)

(52) U.S. Cl.
CPC ...... *H01L 21/02164* (2013.01); *H01L 21/022* (2013.01); *H01L 21/0234* (2013.01);
(Continued)

(58) Field of Classification Search
CPC ............ H01L 21/049; H01L 21/02252; H01L 21/02304; H01L 21/02271;
(Continued)

(56) References Cited

U.S. PATENT DOCUMENTS 3,400,309 A * 9/1968 Doo ........................ H01L 23/29
257/506
5,698,472 A 12/1997 Harris
(Continued)

FOREIGN PATENT DOCUMENTS

CN 102142369 A 8/2011
CN 105280503 A 1/2016
(Continued)

OTHER PUBLICATIONS

6. Watanabe et al., "Fundamental Aspects of Silicon Carbide Oxidation", 2013, Physics and Technology of Silicon Carbide Devices, INTECH, pp. 235-250, Dec. 2013. (Year: 2013).*
(Continued)

*Primary Examiner* — Nikolay K Yushin
(74) *Attorney, Agent, or Firm* — Dority & Manning, P.A.

(57) ABSTRACT

A method of manufacturing an insulation layer on silicon carbide includes first preparing a surface of the silicon carbide, then forming a first part of the insulation layer on the surface at a temperature lower than 400° Celsius. Finally, a second part of the insulation layer is formed by depositing a dielectric film on the first part. The surface of the silicon carbide is illuminated by a light at a wavelength below and/or equal to 450 nm during and/or after the formation of the first part of the insulation layer.

7 Claims, 5 Drawing Sheets

(51) Int. Cl.
*H01L 21/04* (2006.01)
*H01L 29/00* (2006.01)
*H01L 29/16* (2006.01)

(52) U.S. Cl.
CPC .. *H01L 21/02236* (2013.01); *H01L 21/02252* (2013.01); *H01L 21/02348* (2013.01); *H01L 21/049* (2013.01); H01L 21/0228 (2013.01); H01L 21/02274 (2013.01); H01L 29/1608 (2013.01)

(58) Field of Classification Search
CPC .............. H01L 21/02236; H01L 21/022; H01L 21/0234; H01L 21/02164; H01L 21/02348; H01L 21/0228; H01L 21/02274; H01L 29/1608; H01L 29/7869; H01L 29/78693; H01L 29/66068
See application file for complete search history.

(56) References Cited

U.S. PATENT DOCUMENTS

| | | | | |
|---|---|---|---|---|
| 7,820,558 | B2* | 10/2010 | Ohmi | H01J 37/32192 438/778 |
| 7,880,173 | B2 | 2/2011 | Fukuda et al. | |
| 8,647,993 | B2* | 2/2014 | LaVoie | H01L 21/02126 438/776 |
| 2005/0245034 | A1* | 11/2005 | Fukuda | H01L 29/1608 438/285 |
| 2008/0135954 | A1* | 6/2008 | Ohmi | H01L 29/6606 257/411 |
| 2011/0169015 | A1 | 7/2011 | Negoro et al. | |
| 2013/0230987 | A1 | 9/2013 | Draeger et al. | |

FOREIGN PATENT DOCUMENTS

| | | |
|---|---|---|
| JP | H1167757 A | 3/1999 |
| JP | 2001244260 A | 9/2001 |

OTHER PUBLICATIONS

German Search Report DE102017200615.3, dated Sep. 6, 2017. (12 pages).

International Search Report PCT/EP2017/083988, dated Mar. 8, 2018. (3 pages).

International Preliminary Report on Patentability PCT/EP2017/083988, dated Mar. 29, 2019. (13 pages).

Gerald Lucovsky et al.: "Remote plasma-assisted oxidation of SiC: a low temperature process for SiC-SiO2 interface formation that eliminates interfacial Si oxycarbide transition regions; Remote plasma-assisted oxidation of SiC", Journal of Physics: Condensed Matter, Institute of Physics Publishing, Bristol, GB, vol. 16, No. 17, May 5, 2004 (May 5, 2004), pp. S1815-S1837, XP020059489, ISSN: 0953-8984, DOI: 10.1088/0953-8984/16/17/018.

* cited by examiner

METHOD OF MANUFACTURING AN INSULATION LAYER ON SILICON CARBIDE

FIELD OF THE INVENTION

The present invention relates generally to a method of manufacturing an insulation layer on silicon carbide.

BACKGROUND

U.S. Pat. No. 7,880,173 B2 discloses a semiconductor device and method of manufacturing a semiconductor device. It discloses that on a silicon carbide substrate a gate insulation layer is formed. It explains that the gate insulation layer is formed by oxidization of the surface of silicon carbide in an atmosphere containing $O_2$ or $H_2O$ at a temperature within the range of 800° Celsius to 1200° Celsius having a thickness of approximately 50 nanometers. Alternatively it teaches the use of a low temperature oxide which was formed by reacting silane and oxygen at 400° Celsius to 800° Celsius to deposit silicon oxide on the silicon carbide substrate.

US 2011/0169015 A1 also discloses a semiconductor device and method of manufacturing such a device. It discloses that on a silicon carbide substrate a surface protective film is formed. It explains that the surface deactivation layer of the surface protective film is formed by oxidation of the surface of silicon carbide in an atmosphere containing $O_2$ and $H_2O$ at a temperature of 1000° Celsius for 1 to 4 hours having a thickness of approximately 10 nanometers. The formation of the surface deactivation layer is followed by the deposition of silicon oxide containing phosphorus and further deposition of silicon nitride to formulate the surface protective film. This surface protective film is also an insulation layer on silicon carbide.

U.S. Pat. No. 5,698,472 discloses the use of ultraviolet light during the oxidation of SiC surface, while the oxidation takes place at temperatures of above 900° Celsius. The wavelength of the ultraviolet light is between 115 and 180 nm.

SUMMARY

The method of manufacturing an insulation layer on silicon carbide according to example aspects of the invention exhibits the following advantages over the above cited prior art.

When a surface of silicon carbide is oxidized without enough energy to oxidize carbon, the residual carbon atoms stay in the formed silicon oxide film. These carbon atoms are bound to the matrix of the silicon oxide at a binding energy around 2.7 eV-5 eV. If the surface of the silicon carbide is illuminated with a light whose wavelength is shorter than 450 nm when the silicon oxide is formed, the photons in the light have energy larger than 2.75 eV, and each photon can release a carbon atom whose binding energy is smaller than the energy of the photon. When the light has a luminescence distribution of wavelength with its peak shorter than 450 nm, the residual carbon can be prevented during the formation of the silicon oxide. The released carbon atoms are also oxidized and removed as gaseous carbon monoxide or carbon dioxide.

Since according to example aspects of the invention, the insulation layer is formed at temperatures lower than 400° Celsius, the unoxidized carbon atoms are higher in number at the interface of SiC and the insulation layer causing interface defects when the oxidation takes place without being illuminated. These interface defects cause a slowing down of electrons moving parallel to the surface. In addition, dielectric properties and the stability of the insulation layer are negatively affected by unoxidized carbon atoms. The illumination according to example aspects of the invention reduces or even eliminates such negative effects because the carbon atoms are oxidized in the above described manner. Ultimately, devices, such as transistors, made of such manufactured SiC are of better quality with improved electric and/or optical properties.

Due to the forming of an insulation layer lower than 400° Celsius according to example aspects of the invention, the thermal stress is much less after cooling down to room temperature than in the prior art. This improves for example the electrical performance of a transistor device like MOSFET (metal-oxide-semiconductor field effect transistor) or BJT (bipolar junction transistor) which is made of silicon carbide. A dielectric film according to example aspects of the invention can exhibit a high dielectric constant which is potentially beneficial to the performance of, for example, a MOSFET. Due to a first part of an insulation layer between the substrate of the silicon carbide and the dielectric film, an improved interface quality is realized which would be bad if the dielectric film is deposited directly on the silicon carbide.

The dielectric film may be formed of or with of materials like aluminum oxide, aluminum oxide nitride, hafnium oxide, hafnium silicide, hafnium aluminum oxide, zirconium oxide, zirconium silicide, titanium oxide, lanthanum oxide, silicon nitride, silicon oxide nitride or deposited silicon oxide. The insulating layer consists of two layers, a thin silicon oxide layer formed by oxidizing the silicon carbide surface and another dielectric film deposited on the thin silicon oxide layer.

In addition, the first part of the insulation layer on the surface of the silicon carbide could be realized with available technology without too much additional cost.

Illuminating the surface means that the light with a wavelength equal or shorter than 450 nm is sent to the surface, so that the surface of the silicon carbide is exposed to this light. The light may be monochromatic but it needs not to be, so the light may be distributed over a wide range of wavelength. It is possible that a considerable part of the light emitted from the light source may be at wavelength over 450 nm, it is only necessary that there is also light equal and/or below 450 nm in order to enable the oxidization of the carbon atoms. The illumination may be continuous or pulsed during the formation of the first part of the insulation layer and/or after that.

The light source may be any device that emits the necessary light.

Moreover, the method according to example aspects of the invention shows considerable advantages over cited prior art and would lead for example to a much improved transistor device made of silicon carbide.

An example feature of the invention is that the light is preferably equal and/or below 380 nm because this light is richer in energy and therefore more helpful to enable the oxidization.

Another example feature of the invention is that the light source contains at least a lamp or a laser or a light emitting diode. Examples for lamps emitting such light are ultraviolet lamps using cold discharge in an Hg ambient. Such lamps are best employed keeping them in a continuous mode. It is possible to use more than one lamp. Other examples for such lamps are gas-discharge lamps such as Argon and deuterium arc lamps. Other examples for such lamps are excimer lamps which produce ultra violet light by spontaneous emission of excimer molecules. Lasers could be gas lasers, laser diodes or solid-state lasers. Examples are nitrogen gas laser, excimer laser. Even ultraviolet LEDs are available. Ultraviolet light may be generated using nonlinear effects such as mixing. If needed, optics could be added to direct the light to the surface. A scanning by lasers may be implemented to cover the whole surface of the silicon carbide. Alternatively, it is possible to combine lasers and lamps and diodes or any combination thereof in one light source.

It is another example feature of the invention that the light source emits the light with a density of photons on the surface that is higher than the density of carbon atoms on the surface. Otherwise not all carbon atoms may be oxidized.

It is another example feature of the invention that the silicon oxide as the first part of the insulation layer is formed by exposing the surface to ozone. This ozone is at partly generated by illuminating oxygen by the same light that is also illuminating the surface of the silicon carbide. Another advantage is that the method may consist of using ozone or $O_2$ plasma which is brought in the contact with the surface to generate the silicon oxide film. Both ozone $O_3$ and $O_2$ plasma are powerful oxidants.

It is an example feature of the invention that, apart from the oxygen, gaseous nitrogen oxides are provided. The nitrogen oxides improve the interface quality between silicon carbide and silicon oxide which has been shown empirically.

Another example feature of the invention is that the illumination takes place between the formation of the first and the second part of the insulation layer using an atmosphere containing at least hydrogen. When residual carbon atoms stay in the formed silicon oxide film, the atomic bonds which bind carbon atoms to the matrix of the silicon oxide may be disconnected by illuminating the surface of the first part of the insulation layer with a light shorter than 450 nm. If hydrogen species are provided from the atmosphere simultaneously, the released carbon atoms react with the hydrogen species and gaseous methane ($CH_4$) molecules are generated. Because hydrogen species are small enough to pass through into the matrix in general, the hydrogen species may be distributed inside the matrix with a sufficient density to react with the released carbon atoms by just locating the silicon oxide as the first part of the insulation layer on the surface of the silicon carbide in an atmosphere containing hydrogen species. The size of the generated methane molecules is also small enough to be emitted from the matrix, although the size is larger than that of hydrogen species.

It is an example feature of the invention that the hydrogen is provided at least as molecules and/or ions and/or radicals. The hydrogen species can be just hydrogen molecules ($H_2$), but also can be ions of hydrogen molecules ($H_2^+$), ions of hydrogen atoms ($H^+$), radicals of hydrogen molecules ($H_2^*$) and radicals of hydrogen atoms ($H^*$). The atmosphere may contain one or any combinations of these species. Hydrogen molecules are already somewhat reactive, but ions and radicals are more reactively enhancing the generating process of the methane, and even assisting the releasing process of the carbon atoms from the matrix. Furthermore, ions and radicals of hydrogen atoms are much smaller than hydrogen molecules, which make ions and radicals of hydrogen atoms easy to go through into the matrix of the silicon oxide. The ions and the radicals of hydrogen species may be generated, for example, through a plasma process or a catalytic decomposition process from hydrogen molecules, that is, commercially available $H_2$ gas.

It is an example feature of the invention that the plasma also generates a light whose wavelength is shorter than 450 nm in a certain condition and the light may be used for illuminating the surface of the first part of the insulation layer on the silicon carbide. Example of the condition is irradiating microwave to the $H_2$ gas which generates ultraviolet light with wavelength around 250-400 nm. A mixed gas of $H_2$ and argon (Ar) even enhances optical emission of wavelength around 260-350 nm. Instead of Ar, other examples of inert gas include, xenon (Xe), krypton (Kr), etc. Another example of induction source of plasma like RF (radio frequency) discharge may also work.

The method of manufacturing an insulation layer on silicon carbide may be a method which has steps in different machines. The method may be an automated process but it is possible to do parts or all steps manually. Manufacturing means that this insulation layer on silicon carbide is formed by oxidizing the silicon carbide followed by depositing another dielectric film.

Silicon carbide is a semiconductor which is used for high power and/or high temperature applications. Silicon carbide devices may carry a high current density and work under conditions with high temperature or/and high radiation. Especially for MOSFETs which are well known from other semiconductors like silicon or gallium arsenide are used in a wide range of applications. It is also the same for BJTs. Silicon carbide may also be used for light emitting or light receiving semiconductor devices, such as light emission diodes or photo diodes esp. using blue light.

A transistor device made of silicon carbide may be manufactured using the following technologies. In case of transistor device manufacturing out of silicon carbide, a polytype called 4H—SiC is normally preferred because its electrical property is suitable to perform as a transistor device especially for high power and/or high temperature applications. The ingot of 4H—SiC is epitaxially grown on the seed crystal normally with a sublimation method. Unlike silicon, silicon carbide does not have liquid phase at a practical pressure, therefore the solidification of the melt is not available.

After a silicon carbide substrate is made of the ingot by slicing, at least one of the surfaces of the substrate is polished mechanically and chemically. Above the polished surface, high-quality 4H—SiC layer is epitaxially grown at vapor phase using chemical reaction of silicon hydride and carbon hydride. During the epitaxial growth, several layers may be grown, each of which has a certain thickness and a different impurity doping which may designate the conducting type (p-type or n-type) and the conductivity of the layer. After the multi layers of silicon carbide are grown, part of the surface is excavated locally using dry or wet etching, and/or part of the surface gets further impurity doping locally using ion implantation or equivalent local doping method, with the help of surface patterning technologies like photolithography.

An insulating layer is formed to cover the exposed surface of the silicon carbide, and the layer is locally removed where the silicon carbide is to be connected to the metal electrode. After the metal electrode is formed with an appropriate material of metal with an adequate size and thickness on each of the locally removed insulating layer, transistor devices are diced out of the substrate where multiple devices are formulated throughout the processes mentioned above. The control of each process step like epitaxial layer, local etching, local doping, insulating layer patterning, and metal formation is according to the design of the finished device. The semiconductor device according to example aspects of the invention may be the above mentioned devices such as a MOSFET or a BJT. But it is not limited to those devices.

Any device using an insulation layer may benefit from example aspects of the invention described here.

An insulation layer is a layer which insulates electrically a metallization from the semiconductor. That means there is no current flowing except unwanted currents like a leakage current. By using the electric field of the electric charges in the metallization, it is possible to influence the current flow in the semiconductor. Thus, controlling the current is possible. This is used for example in MOSFETs.

An insulation layer is also expected to deactivate the surface of the semiconductor. When the semiconductor surface is exposed, high density of surface states are formed causing relatively large base current of a device like a BJT. Since a current gain (=principal current/base current) is an important performance factor of BJT, the base current is desired to be reduced. When the insulation layer properly deactivates the surface, the generation of surface states are suppressed, and the base current, one of whose path is at the surface, is significantly decreased. The improvement of the surface deactivation is important to the performance of a BJT.

The preparation of a surface of the silicon carbide is normally performed as described below. This preparation of the surface of the silicon carbide is normally the removal of silicon oxide, which is often the native oxide which exists due to the exposure of silicon carbide to air.

The native oxide is irregular in thickness and too thin to be usable for forming a reliable insulation layer. The native oxide is normally removed by 5-10% HF solution. Alternatively instead of native oxide, other type of silicon oxide may exist as a result of the previous processes.

When the previous process includes local doping by ion implantation, it must be followed by post-implantation high-temperature anneal to recover the crystal structure damaged by ion implantation and to activate the implanted species as donor or acceptor. A thin carbon capping film is often formed before this post-implantation to prevent surface roughening, and this carbon capping film must be removed by $O_2$ plasma or low temperature (700-800° Celsius) oxidation. This leaves a few nanometers of silicon oxide, but it is also unreliable to use for the gate insulating layer or the surface protective layer. This silicon oxide may also be removed by 5-10% HF solution, but the HF concentration can be higher up to 65% to shorten the process time.

In another case, especially when the previous process includes reactive ion etching (RIE) to make a trench structure or a mesa structure on the surface of the silicon carbide, a thick oxide is formed before the preparation, for example, using pyrogenic oxidation at a temperature 1000° Celsius or higher for longer than 5 hours, which is sometimes called as sacrificial oxidation because the layer sacrifices itself by the subsequent removal where ion bombardment damage was induced by the previous RIE process. After the removal of the thick oxide, the exposed surface and the near-surface layer of the silicon carbide are expected to be made of very high-quality crystal of silicon carbide which were isolated and protected from the ion bombardment. To remove the thick oxide, 5-10% HF is possible to use, but 50-65% HF is preferably used to shorten the process time.

But other preparation steps for cleaning the surface and preparing the surface for the further steps may be included here. Especially the use of photo lithography to define the surface on the silicon carbide may be included here as well. Using photolithography, it is possible to define the device structures on the surface of the silicon carbide in combination with etching, metallizing, deposition of dielectric films or growing silicon oxide.

The first part of the insulation layer on the surface is formed at a temperature lower than 400° Celsius. This could be at a temperature between 0° Celsius and 45° Celsius, for example room temperature at around 20° Celsius. This is a considerable advantage, since thermal stress or a deterioration of interfaces between different films or layers is reduced or even avoided. This process is also possible to be performed without a temperature controller, like a heater or chiller, leading to significant advantage of cost reduction in the manufacturing process.

This first part of the insulation layer may be a silicon oxide film or layer but the first part of the insulation layer may be another layer as well if it is found suitable.

The second part of the insulation layer is a dielectric film. Examples for this dielectric film are given above and not limited to those examples. The dielectric film is deposited using a known technology. This could be done by an atomic layer deposition or by a chemical vapor deposition.

Atomic layer deposition (ALD) is a thin film deposition method in which a film is grown on a substrate by exposing its surface to alternate gaseous species. The species are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. The deposition speed is relatively slow, but the high-quality of the film is expected especially to contribute to the higher breakdown field for the film material.

A chemical vapor deposition (CVD) has the elements or chemical substances that should be deposited in a chemical compound which reacts on the first part of the insulation layer on the surface of the silicon carbide with the deposition of this element or compound. This is possible in a very controlled manner so that the thickness of the dielectric film is properly controlled. ALD is included in CVD in a wider meaning. Other technologies of depositing the dielectric film may be any other vaporization in a high vacuum or an electrodeposition in a fluid.

The thickness of this dielectric film is 20 nm at thinnest and 1000 nm at thickest, which is dependent on the application of the transistor device. In case of MOSFET, a thinner dielectric film may increase the controllable range of the device while the risk of the breakdown of the gate insulator is increased. Therefore, the film may be thinned according to the breakdown field which is one of the properties of the film material, down to the minimum range where the breakdown may be avoided. In case of BJT, the thickness of the film is preferably 150 nm or more, more preferably 150 nm to 1000 nm. 150 nm is a typical thickness of the metal electrode and the dielectric film is preferably thicker than the metal to ensure the process to form the metal. The film thicker than 1000 nm does not increase the advantage in spite of the extended processing time.

An advantageous characteristic of the semiconductor device and the method of manufacturing the insulation layer on the silicon carbide is that the first part, especially the silicon oxide film, is very thin with a thickness between 0.5 nanometer and 10 nanometers. This layer deactivates the surface of the silicon carbide by terminating the dangling bonds which cause the generation of the surface states where electrons and holes are uncontrollably recombined. The effect of the surface deactivation suppresses the generation of the surface states; decreases the recombination of the electrons and holes; and thus enhances the controllability of the semiconductor device; therefore the performance of the device is improved.

Another role of the thin silicon oxide is to protect the silicon carbide surface from the direct deposition of the dielectric film above. Although the film property is potentially desirable for its large dielectric constant or its high breakdown field, or the deposition temperature is low enough to avoid the thermal stress after cooling down, the uncontrolled interface implemented by the direct deposition could often extinguish those desirable potentials. For example, fixed charges are accumulated near the interface in the deposited film, which causes the bending of the energy band of the silicon carbide near the interface, resulting in slowing down the moving speed of the electrons or holes. The thin oxide suitably accommodates the ground for the dielectric film deposition to avoid the accumulation of the fixed charges at the initial stage of the deposition. Therefore, the desired potentials described above may be utilized without slowing down the speed of the electrons or the holes.

The first part of the insulation layer, e.g., the silicon oxide layer, is partly formed on the silicon carbide, for example on those parts necessary for forming a MOSFET or a BJT. It is also possible to cover the whole surface of the silicon carbide substrate with this film, if it is needed or beneficial for the manufacturing process.

A further example advantage is that, after having deposited the dielectric film, the insulation layer on the silicon carbide is annealed at a temperature of at least 50 Kelvin (K) higher than the peak temperature during the deposition of the dielectric film. This annealing step enhances the deactivation effect by the thin oxide of the silicon carbide surface. In most cases, the deposition of the dielectric film contains some kind of hydride gas, which leaves excess hydrogen inside the film. This excess hydrogen is released by the annealing at higher temperature than the deposition temperature, and helps the termination of the dangling bonds of the silicon carbide surface which are not yet terminated at the step of the thin oxide formation. The excess hydrogen also terminates the dangling bonds inside the thin oxide, which increases the breakdown field of the thin oxide. The annealing is also effective to improve the quality of the deposited dielectric film itself. Besides excess hydrogen, there are very likely other unwanted byproducts generated by the contained materials for deposition. These byproducts are evaporated by annealing, and the film is increasingly purified.

An advantageous embodiment of a semiconductor device manufactured according to the invention is a MOSFET and a BJT. But it is possible to employ the described invention in any other device which needs such an insulation layer on the surface of silicon carbide.

FIGURES

Example embodiments of the invention are described below referring to figures showing the example aspects of the invention.

FIG. 1 shows a flowchart of example aspects of an inventive method of manufacturing;

FIG. 2 shows a cross-section of the semiconductor device showing the preparation of the surface;

FIG. 3 shows a cross-section of the semiconductor device showing forming of the silicon oxide layer;

FIG. 4 shows an alternative method of forming the silicon oxide layer;

FIG. 5 shows the deposition of the dielectric film;

FIG. 6 shows flowchart of example aspects of the inventive method with additional steps;

FIG. 7 shows a first example embodiment after the inventive method;

FIG. 8 shows a second example embodiment after the inventive method;

FIG. 9 shows a third example embodiment after the inventive method;

FIG. 10 shows a fourth example embodiment after the inventive method and

FIG. 11 shows a fifth example embodiment after the inventive method.

DESCRIPTION OF THE FIGURES

Reference will now be made to embodiments of the invention, one or more examples of which are shown in the drawings. Each embodiment is provided by way of explanation of the invention, and not as a limitation of the invention. For example, features illustrated or described as part of one embodiment can be combined with another embodiment to yield still another embodiment. It is intended that the present invention include these and other modifications and variations to the embodiments described herein.

In step 301, the forming of the first part of the insulation layer on the silicon carbide is performed. As explained above and later below, this first part of the insulation layer is a silicon oxide film which is between 0.5 nanometer and 10 nanometers. This film could be grown below 400° Celsius, preferably between 0° Celsius and 45° Celsius. Ozone or $O_2$ plasma may be used or chemicals the examples of which are as following. 68% $HNO_3$ at room temperature (neither heating nor cooling) for 60 minutes, or 68% $HNO_3$ at 100-121° Celsius for 30 minutes is an example. Both temperature range and duration range may be larger. When chemicals are used to grow the silicon oxide, rinsing by water, especially deionized water, and drying the substrate normally follow. During the formation of the first part of the insulation layer, the surface of the silicon carbide is illuminated by a light with a wavelength of 450 nm or shorter by a light source which may contain lamps, lasers or LEDs emitting such light. The light may generate the ozone from oxygen. Alternatively, the illumination takes place between step 301 and 302 for example in an ambient of hydrogen.

In step 302, the dielectric film is deposited on this first part of the insulation layer. The dielectric film may be, for example, aluminum oxide, aluminum nitride, aluminum oxide nitride, hafnium oxide, hafnium aluminum oxide, hafnium silicide, zirconium oxide, zirconium silicide, titanium oxide, lanthanum oxide, silicon nitride, silicon oxide nitride or silicon oxide again. So by having the first part of the insulation layer, which is the silicon oxide film, and also the dielectric film, a good insulation is achieved for controlling the current flowing from source to drain by an electric field which is controlled over the gate electrode 13, 23. The advantage of atomic layer deposition is its excellent controllability of stoichiometry and thickness, including its uniformity. The gate insulator must be thin and uniform with high quality. Atomic layer deposition method may satisfy these requirements. On the other hand, chemical vapor deposition, which is sometimes enhanced by plasma, has an advantage of depositing closely packed film with relatively low cost. It is desirable for the surface protective film. The deposition temperature is typically 400° Celsius, or more widely, in the range of 150° Celsius-450° Celsius, to keep the excess hydrogen within.

Figure 1:
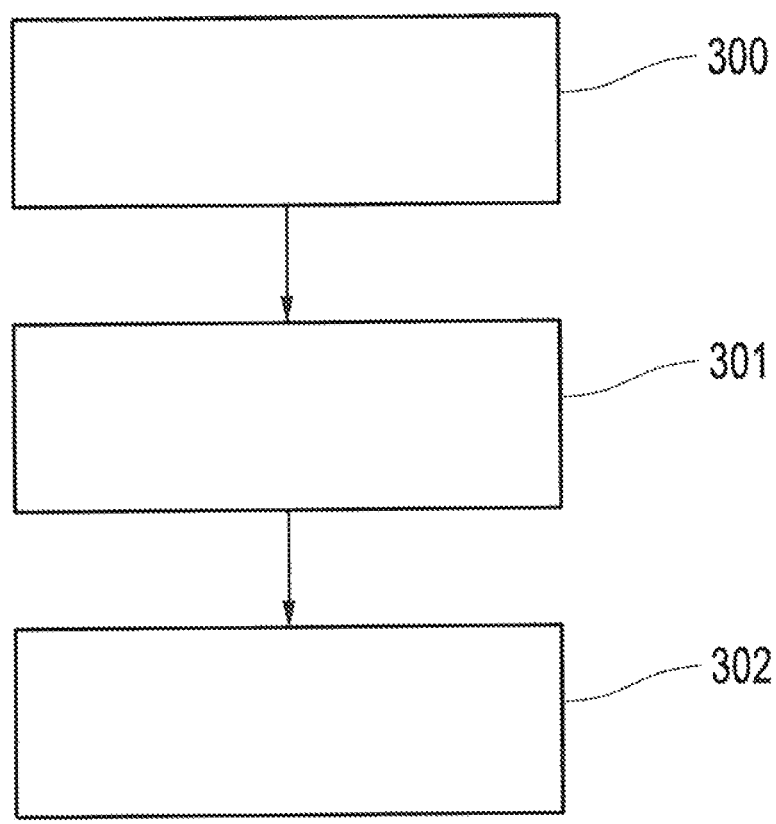
FIG. 1 shows a flowchart of manufacturing an insulating layer on the surface of the silicon carbide. The first step 300 is to prepare the surface of the silicon carbide for the further steps. This preparation is usually the removal of: (1) the native oxide; or (2) the silicon oxide formed during the carbon cap removal process for post-implantation; or (3) the sacrificial oxide which was damaged by ion bombardment during RIE and subsequently oxidized, on the silicon carbide. This can be achieved for example by using hydrofluoric acid. The symbol HF is used for this and it is normally dissolved in water. Alternative chemicals may be used for removing the residual oxidation layer but hydrofluoric acid is well proven. The etching away of this oxide layer may be achieved by HF dissolved in water or by the hydrofluoric acid in a vapor. Other chemicals of course may also be used.
Figure 2:
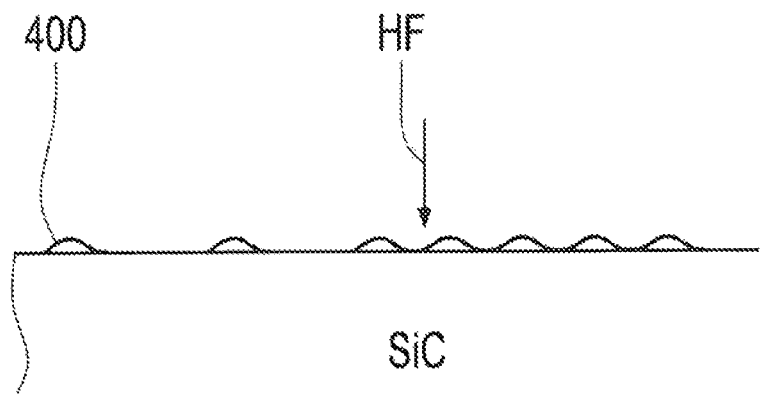

In FIG. 2, shows how the residual oxidation layer 400 on the silicon carbide SiC is removed by using hydrofluoric acid HF. This could be in combination with using photoresist defining those areas on the surface of the silicon carbide which should be cleaned by the hydrofluoric acid HF. Photolithography with photoresist is the usual way to pattern semiconductor devices from above. Edging and metallization are applied as needed. For simplicity photolithography is not shown in the figures. Again, this step is performed at a temperature between 0° Celsius and 45° Celsius, preferably at room temperature of 20° Celsius or 21° Celsius.

Figure 3:
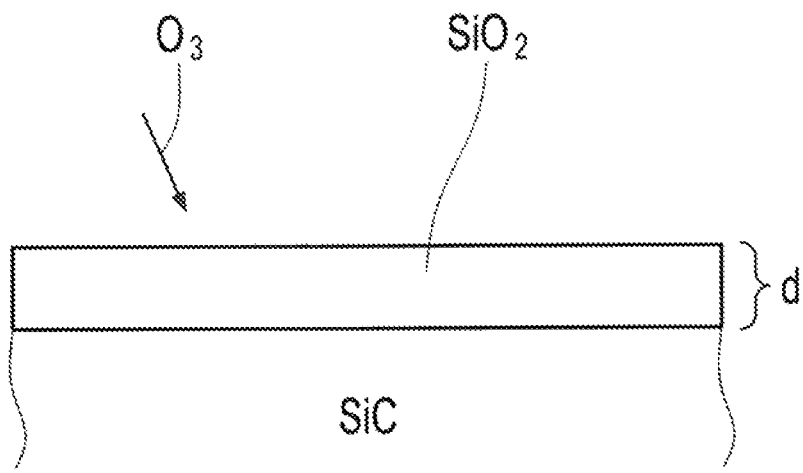

FIG. 3 shows the forming of the silicon oxide layer $SiO_2$ on the silicon carbide SiC. The thickness of the silicon oxide layer $SiO_2$ is designated by the letter d. In the example shown in FIG. 5, the silicon oxide layer $SiO_2$ is formed by using ozone $O_3$. This is also done at a temperature below 400° Celsius. According to example aspects of the invention, this is supported by illuminating the surface by a light at a wavelength of 450 nm or shorter.

Figure 4:
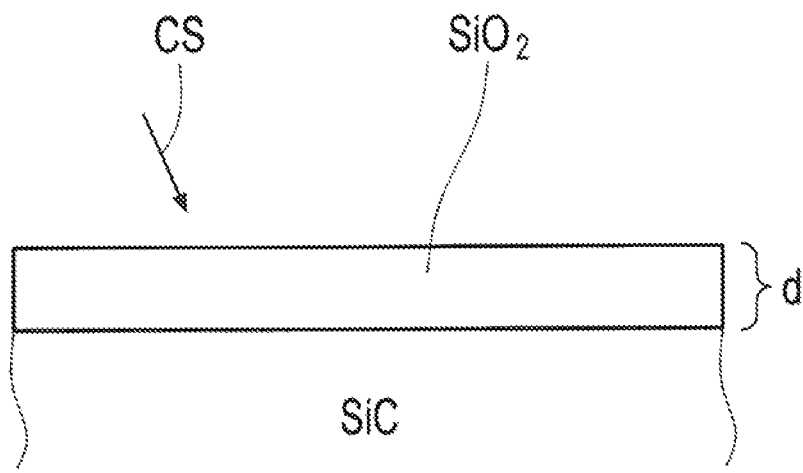

FIG. 4 shows an alternative for forming the silicon oxide layer $SiO_2$ with the thickness d on the silicon carbide SiC. Here a chemical solution CS is used for forming the silicon oxide layer $SiO_2$. Examples for this chemical solution are mentioned as following. A solution could be used which includes nitric acid or hydrogen peroxide or sulfuric acid or hydro fluoric acid or ozone or acetic acid or boiling water or ammonium hydride or any combination thereof. This alternative is also realized at a temperature below 400° Celsius. This is then followed by the above described illumination.

Figure 5:
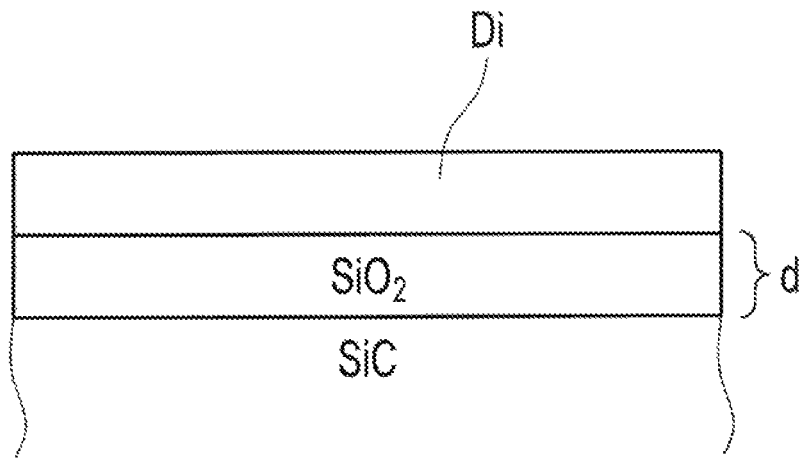

FIG. 5 shows the next step, mainly the deposition of the second part of the insulation layer or dielectric film Di on the silicon oxide layer SiO2 with the thickness d on the surface of the silicon carbide substrate SiC. The dielectric film Di is made of those elements mentioned above and may be deposited by atomic layer deposition or chemical vapor deposition or any other means of depositing such a dielectric film.

Especially forming of the first thin silicon oxide film is done at temperatures below 400° Celsius preferably at room temperature from 0° Celsius to 45° Celsius. Thermal stress between the thin silicon oxide and the silicon carbide may be avoided in this way. The silicon oxide provides excellent interface quality by the following process of dielectric film coating. The dielectric film also complements the thin oxide with having high permittivity and insulating capability. These features increase the reliability and controllability of this gate structure.

Figure 6:
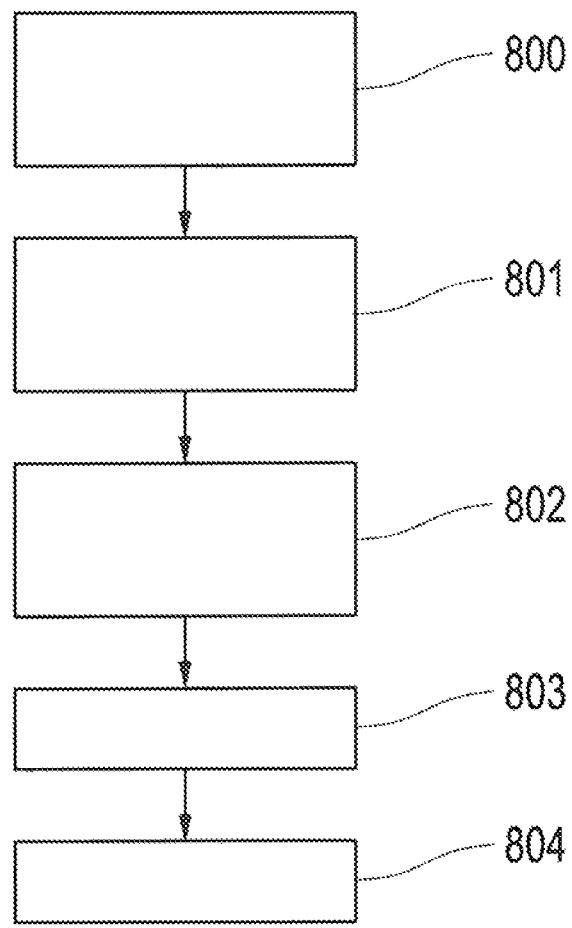

FIG. 6 shows a second flowchart of manufacturing the insulating layer on the silicon carbide. In step 800, the cleaning of the surface of the silicon carbide is performed. In step 801, a chemical solution is used for forming the first part of the insulating layer, namely the silicon oxide film. After the formation of the silicon oxide, rinsing by water, especially deionized water, and drying the substrate normally follow. This could be also achieved by using ozone or $O_2$ plasma at temperatures below 400° Celsius preferably at room temperature. Here, the illumination according to example aspects of the invention takes place.

In step 802, the dielectric film is deposited. This is done using atomic layer deposition or chemical vapor deposition or any other means of depositing such a dielectric layer. It is for example possible to use electrodeposition.

In step 803, an annealing of this structure having the silicon oxide layer and the dielectric film is performed at least at 50 Kelvin higher than the deposition of the dielectric layer. A typical annealing temperature is 450° Celsius for a film deposited at 350° Celsius. The annealing step release excess hydrogen from the deposited film, and the part of the hydrogen reaches the interface of the thin silicon oxide and the silicon carbide. The hydrogen improves the film quality of the thin silicon oxide by terminating the dangling bonds in the oxide, and also improves the quality of the interface by terminating the dangling bonds at the surface of the silicon carbide.

After that, in step 804, further steps of making the semiconductor device with the inventive insulating layer are performed. This is for example the metallization on the dielectric layer in order to have a complete gate structure. In some cases, one of these further steps, for example a sintering process of the metal electrode, may also play the role of the annealing step 803 if the process condition satisfies the requirement. In other words, one annealing step in the further steps can play two or more roles including termination of dangling bonds in the thin oxide and the surface of the silicon carbide in step 803. This means no additional cost is required for the annealing step 803.

Figure 7:
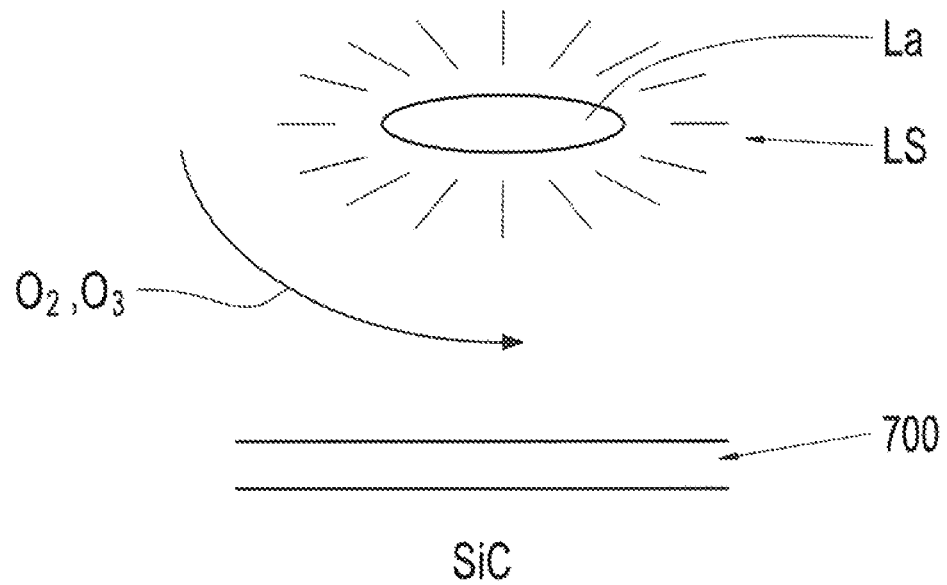

FIG. 7 shows a first example embodiment of the above described method. A lamp La emitting ultraviolet light at and/or below 450 nm is used as a light source (LS). The lamp La illuminates the surface of the silicon carbide SiC with the first part of the insulation layer 700. This layer 700 is formed by using oxygen $O_2$ and ozone $O_3$. Ozone is manufactured using the light of the lamp La. Alternatively, a gaseous nitride oxide, e.g. nitrous oxide ($N_2O$), may be added to oxygen, which is expected to improve the interface quality between the formed silicon oxide and the silicon carbide.

Figure 8:
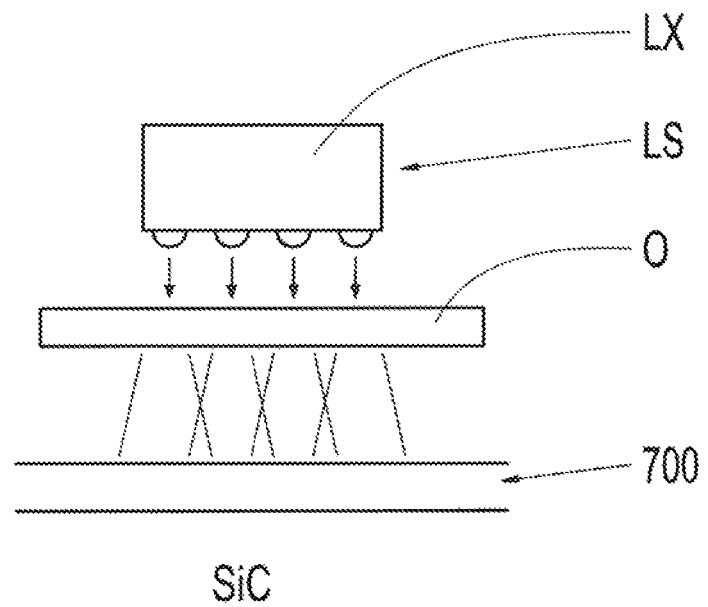

FIG. 8 shows a second example embodiment of the above described method. As a light source LS, a laser module LX is used with several laser diodes. Their emitted light is scattered using the optics O which may be an element with several holes in it. Alternatively, an optics for scanning the surface of the silicon carbide may be employed.

Figure 9:
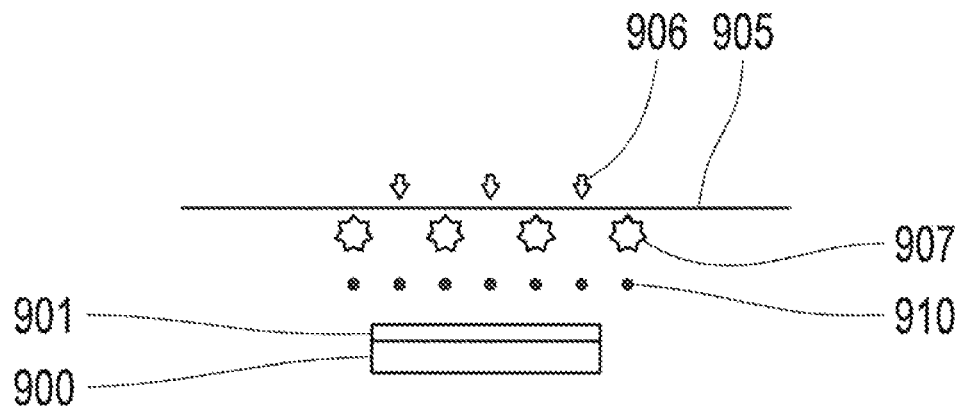

FIG. 9 shows a third example embodiment of the above described method, wherein a light is illuminated in an atmosphere containing hydrogen and hydrogen radicals using catalytic decomposition after the formation of the first part of the insulation layer as a silicon oxide film. A silicon carbide substrate 900 with a silicon oxide film 901 as the first part of the insulation layer is located in a reaction chamber which is isolated from outside with a wall 905. The chamber has an evacuation system which properly controls the pressure inside the chamber as well as safely isolates hydrogen contained atmosphere from outside. Hydrogen ($H_2$) gas is introduced from gas inlets 906 and the pressure is controlled at 3 Pa, though the pressure value may be lower or higher to optimize the reaction. In the atmosphere, other inert gases, like $N_2$, Ar, Xe, etc., may also exist together.

Inside the chamber underneath the gas inlets 906, linear ultraviolet (UV) lamps 907 perpendicular to the plane of FIG. 9 are arranged. The wavelength of the UV lamp is typically 172 nm in case of xenon excimer lamp, but other types of linear light sources whose peak wavelength is shorter than 450 nm are also applicable.

Further underneath the UV lamps 907, linear tungsten wires 910 perpendicular to the plane of FIG. 9 are arranged. The diameter of these tungsten wires 910 is typically 0.5 mm, but can be narrower or wider. The tungsten wires 910 may be electrically heated. When the wire temperature is around 1500° C.-2100° C., the wires 910 catalytically decompose hydrogen and generate radicals of hydrogen atoms (H*) and hydrogen molecules ($H_2$*).

These radicals, together with undecomposed $H_2$ molecules, penetrate into the matrix of the silicon oxide 901. Within the silicon oxide 901, the residual carbon atoms are disconnected from the matrix by the photon energy of the light illuminated by the UV lamps 907. The penetrated hydrogen radicals (H*, $H_2$*) and hydrogen molecule ($H_2$) react with these carbon atoms, transform to methane ($CH_4$), and go out of the matrix as relatively small-sized molecules comparing with the networks in the matrix. This reaction may also take place without tungsten wires 910 which means no radical generation but only hydrogen molecules ($H_2$) supplied, but the existence of the wires 910 generating hydrogen radicals accelerate the reaction. In addition, the silicon substrate 900 may be heated from underneath to accelerate the emission of the generated methane gas.

Figure 10:
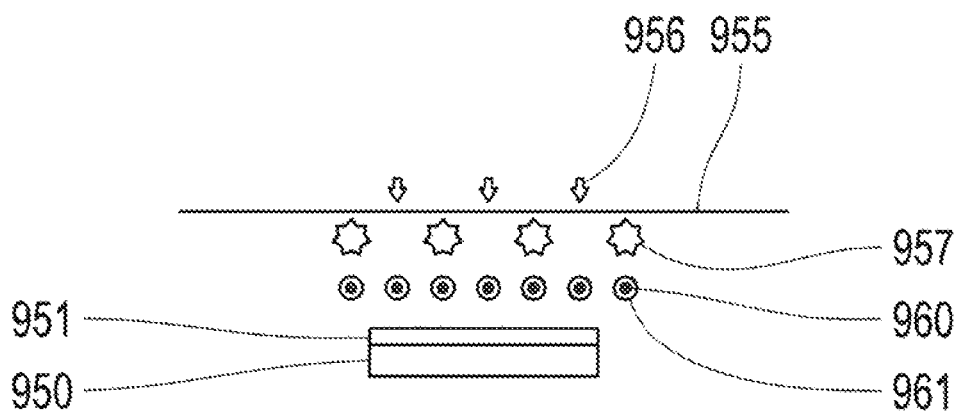

FIG. 10 shows a fourth example embodiment of the above described method, which is similar with FIG. 9 but hydrogen ions may also be introduced using plasma. A silicon carbide substrate 950 with a silicon oxide film 951 as the first part of the insulation layer is located in a reaction chamber which is isolated from outside with a wall 955. The chamber also has an evacuation system which properly controls the pressure inside the chamber, and $H_2$ gas is introduced from gas inlets 956 and the pressure is controlled at 100 Pa, though the pressure value may be lower or higher to optimize the reaction. In the atmosphere, other inert gases, like nitrogen ($N_2$), argon (Ar), xenon (Xe), etc., may also exist together. Linear ultraviolet (UV) lamps 957 perpendicular to the plane of FIG. 10 are arranged similarly with FIG. 9 inside the chamber underneath the gas inlets 956.

Further underneath the UV lamps 957, copper antennas 960 which are linear copper rods perpendicular to the plane of FIG. 10 and whose diameter is typically 3 mm. Each of the copper rods 960 is covered with a quartz tube 961 which shares the same circular center and whose outer diameter is typically 15 mm with 1-mm thick wall. The quartz tubes 961 isolate the copper antennas 960 from the hydrogen-contained atmosphere in the reaction chamber. When very high-frequency power of typically 2.45 GHz with 200 W is applied to each of the antennas 960, microwave energy radially propagates from the antenna 960 towards the quartz tube 961 and microwave plasma is induced outside the surface of the quartz tube 961. The plasma generates hydrogen ions ($H^+$ and $H_2^+$) and radicals (H* and $H_2$*) out of hydrogen molecules ($H_2$).

Similarly with the embodiment described for FIG. 9, these ions, radicals, and undecomposed $H_2$ molecules penetrate into the matrix of the silicon oxide 951 and transform to methane ($CH_4$) together with the residual carbon atoms which are disconnected from the matrix by being illuminated by the UV lamps 957. The presence of ions even accelerates the reaction.

Figure 11:
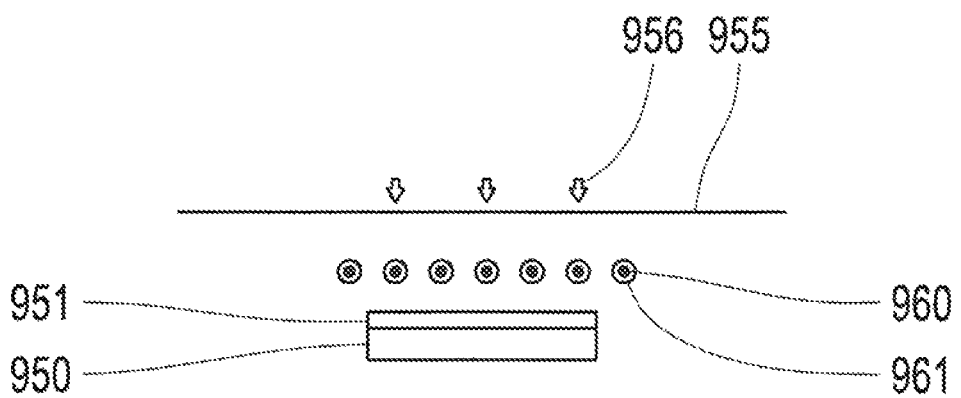

FIG. 11 shows a fifth example embodiment of the above described method, which is similar with FIG. 10 but even without the UV lamps. In this case UV light emission from the hydrogen plasma works as the light source and is used to disconnect the residual carbon atoms in the matrix of the silicon oxide film 951. When some kind of inert gas, typically argon (Ar), is mixed with hydrogen, UV light emission is enhanced and the disconnection of the residual carbon atoms is accelerated.

Modifications and variations can be made to the embodiments illustrated or described herein without departing from the scope and spirit of the invention as set forth in the appended claims.

REFERENCE NUMERALS

300 Preparing a surface of the SiC
301 Forming first part of the insulation layer
302 Depositing dielectric film on first part
400 native oxide layer
d thickness of silicon oxide layer
800 Cleaning
801 Dipping in chemical solution with the surface illuminated by UV light
802 Depositing dielectric film
803 annealing
804 further steps
La lamp
LS light source
Oxygen
Ozone
700 first part of the insulation layer
SiC silicon carbide
LX laser module
Optics
900 silicon carbide substrate
901 silicon oxide film
905 wall of the reaction chamber
906 H2 gas inlet
907 UV lamp
910 tungsten wire
950 silicon carbide substrate
951 silicon oxide film
955 wall of the reaction chamber
956 H2 gas inlet
957 UV lamp
960 copper antenna
961 Quartz tube

The invention claimed is:

1. A method of manufacturing an insulation layer on silicon carbide (SiC), comprising:
   preparing a surface of the silicon carbide (SiC);
   forming a first part of the insulation layer (700, 901, 951) on the prepared surface of the silicon carbide (SiC) at a temperature less than 400° Celsius, the first part of the insulation layer being silicon oxide;
   forming a second part of the insulation layer by depositing a dielectric film on the first part of the insulation layer; and
   illuminating the prepared surface of the silicon carbide (SiC) with light at a wavelength no greater than 450 nanometers during the formation of the first part (700, 901, 951) of the insulation layer using a light source (LS),
   wherein the light source (LS) comprises one or more of a lamp (La), a laser (LX), a light emitting diode, and a plasma,
   wherein the silicon oxide of the first part (700, 901, 951) of the insulation layer is formed by exposing the prepared surface of the silicon carbide (SiC) to ozone ($O_3$), and the ozone is generated at least partly from oxygen (O2) by the light which illuminates the prepared surface of the silicon carbide (SiC), and
wherein nitrogen oxides are provided together with the oxygen (O2).

2. The method of claim 1, wherein the wavelength of the light is no greater than 380 nm.

3. The method of claim 1, wherein the light source (LS) emits the light with a density of photons on the prepared surface of the silicon carbide (SiC) that is greater than a density of carbon atoms on the prepared surface of the silicon carbide (SiC).

4. A method of manufacturing an insulation layer on silicon carbide (SiC), comprising:
preparing a surface of the silicon carbide (SiC);
forming a first part of the insulation layer (700, 901, 951) on the prepared surface of the silicon carbide (SiC) at a temperature less than 400° Celsius, the first part of the insulation layer being silicon oxide;
forming a second part of the insulation layer by depositing a dielectric film on the first part of the insulation layer; and
illuminating the prepared surface of the silicon carbide (SiC) with light at a wavelength no greater than 450 nanometers after the formation of the first part (700, 901, 951) of the insulation layer using a light source (LS),
wherein the light illuminates the prepared surface of the silicon carbide (SiC) between the formation of the first (700, 901, 951) part of the insulation layer and the second part of the insulation layer using an atmosphere containing at least hydrogen.

5. The method of claim 4, wherein that the hydrogen comprises one or more of hydrogen molecules, hydrogen ions, and hydrogen radicals.

6. The method of claim 5, wherein the hydrogen ions, the hydrogen radicals, or both the hydrogen ions and the hydrogen radical are provided using one or both of a plasma and a catalytic decomposition.

7. The method of claim 6, wherein the light generated by the plasma is the light source (LS) that illuminates the first part (700, 901, 951) of the insulation layer.

\* \* \* \* \*